United States Patent
Tung

(10) Patent No.: US 6,258,670 B1
(45) Date of Patent: Jul. 10, 2001

(54) METHOD FOR IMPROVING BREAKDOWN VOLTAGE OF A SEMICONDUCTOR TRANSISTOR

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/310,242

(22) Filed: May 12, 1999

(51) Int. Cl.[7] ............................................. H01L 21/336
(52) U.S. Cl. ....................................... 438/268; 438/197
(58) Field of Search .................................. 438/268, 228, 438/221, 222, 224, 226, 227, 276, 275, 286

(56) References Cited

U.S. PATENT DOCUMENTS

| 5,306,652 | * | 4/1994 | Kwon et al. | 437/40 |
| 5,650,658 | * | 7/1997 | Beasom | 257/409 |
| 6,063,671 | * | 5/2000 | Tung | 438/275 |
| 6,063,674 | * | 5/2000 | Yang et al. | 438/286 |
| 6,110,803 | * | 8/2000 | Tung | 438/442 |

* cited by examiner

*Primary Examiner*—Richard Elms
*Assistant Examiner*—Beth E. Owens

(57) ABSTRACT

A method for forming a semiconductor transistor having high voltage is disclosed. The method includes firstly providing a semiconductor substrate, then forming a well having a first conductivity type in the substrate. Next, a first sub-well having the first conductivity type, and a second sub-well having a second conductivity type contrary to the first conductivity type, are formed in the well. After defining a drift region over the substrate and forming a drift region, in which a substantial portion of the drift region abuts the second sub-well, a field oxide region is formed on the drift region. A gate region is then formed over the substrate, in which a portion of the gate region abuts the field oxide region. Finally, ion implantation is performed to form a source/drain region in the substrate using the gate region and the field oxide region as a mask.

12 Claims, 5 Drawing Sheets

METHOD FOR IMPROVING BREAKDOWN VOLTAGE OF A SEMICONDUCTOR TRANSISTOR

BACKGROUND OF THE INVENTION

1. Field of the Invention

The present invention relates to semiconductor device fabrication, and more particularly, to a method for forming a high-voltage device having high breakdown voltage and a one-sided gate structure.

2. Description of the Prior Art

As the scale of integrated circuits (ICs) has been rapidly decreased, the short channel effect and the hot carrier problem make the design of the ICs more difficult, if not impossible. Therefore, some methods such as lightly-doped drain (LDD) process were disclosed to solve these problems. However, none of these methods solves energy loss and heat dissipation problems.

FIG. 1 shows the cross-section of a conventional complementary metal oxide semiconductor (CMOS) transistor, which usually includes a p-type substrate 10, field oxide regions 4, an n+ source region 2, an n+ drain region 2A, a gate region 3, and an oxide layer 5.

In the structure of the shown transistor, especially of a high-voltage CMOS transistor, the carriers are apt to drift into the substrate 10, disadvantageously incurring bipolar effect. Furthermore, as the length of the channel is decreased, the hot electron effect occurs in addition to the decline of threshold voltage, totally affecting the normal function of the transistors.

Referring back to FIG. 1, it is noted that the traditional high-voltage CMOS transistor includes two-sided field oxide regions 4, which are primarily used to improve the breakdown voltage. Unfortunately, this two-sided field oxide structure decreases driving capability of current. Furthermore, this structure results in an unwanted lateral bipolar junction, reducing its snap-back voltage. Moreover, the area occupied by the two-sided field oxide regions disadvantageously consumes more chip area, making high integration of the circuits impossible. For the foregoing reasons, there is a need for a method of fabricating a semiconductor device having high breakdown voltage while maintaining its current driving capability.

SUMMARY OF THE INVENTION

In accordance with the present invention, a method is provided for forming a high-voltage complementary metal oxide semiconductor (CMOS) transistor whose breakdown voltage is substantially improved. In one embodiment, a semiconductor substrate is provided, followed by formation of an oxide layer on the substrate. Next, ions are firstly implanted into the substrate and are driven in to form a well having a first conductivity type in the substrate. Ions are then secondly implanted into the substrate, and are then driven in to form a first sub-well having a first conductivity type and a second sub-well having a second conductivity type contrary to the first conductivity type, wherein both the first sub-well and the second sub-well are located inside the well. After removing the oxide layer, a pad oxide layer and a silicon nitride layer are formed over the substrate. A drift region is defined and formed over the silicon nitride layer, in which a substantial portion of the drift region abuts the second sub-well. Subsequently, a field oxide region is formed on the drift region, followed by removal of the silicon nitride layer and the pad oxide layer. Finally, a polysilicon gate region is formed over the substrate such that a portion of the gate region abuts the field oxide region. Ions are then implanted to form a source/drain region in the substrate using the gate region and the field oxide region as a mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
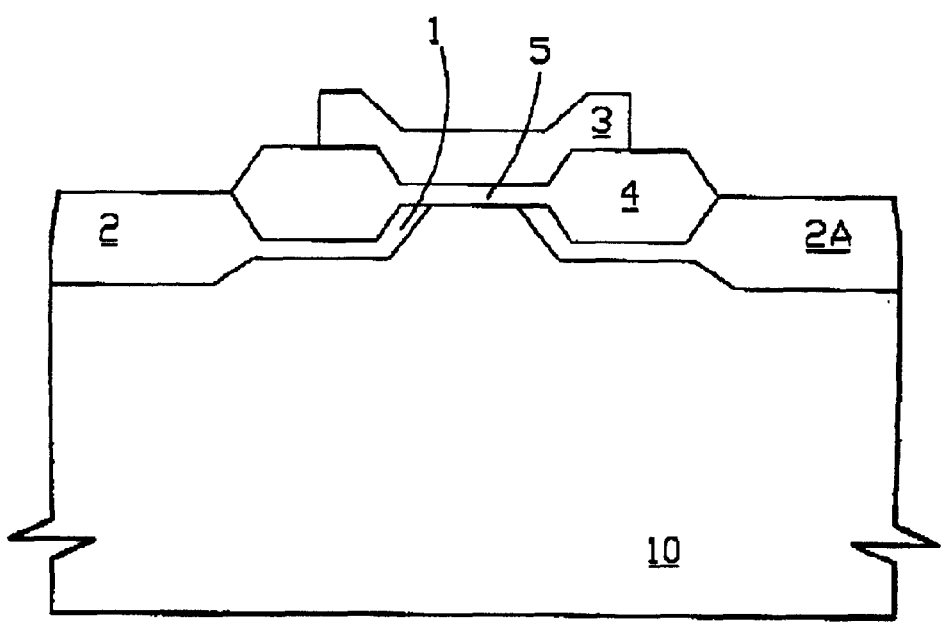
FIG. 1 shows the cross-section of a conventional complementary metal oxide semiconductor (CMOS) transistor.
Figure 2A:
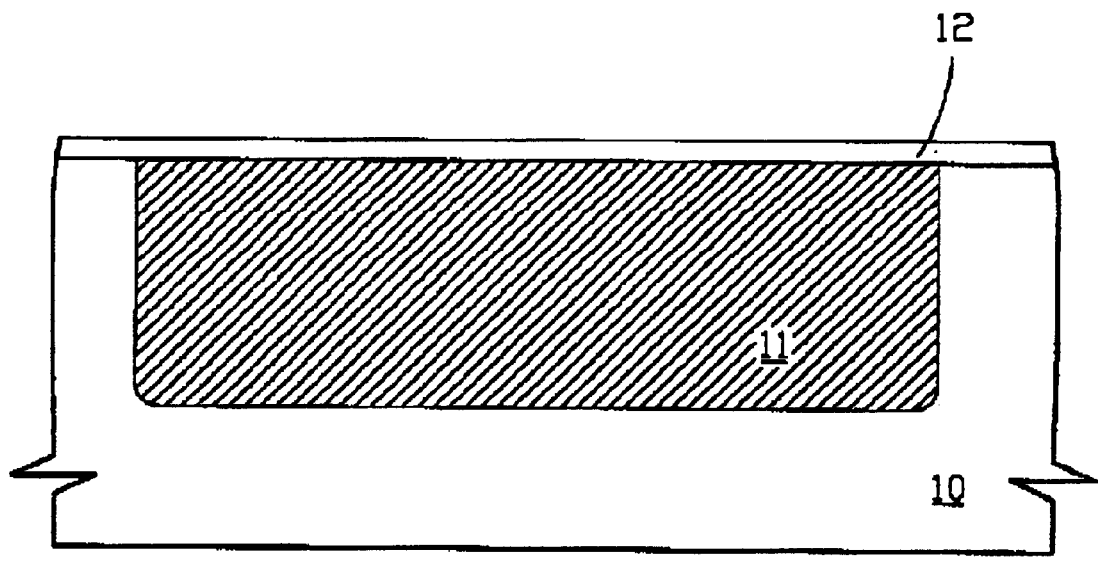
FIGS. 2A to 2G show cross-sectional views illustrative of various stages in the fabrication of a high-voltage semiconductor device in accordance with one embodiment of the present invention.

Referring to FIG. 2A, a silicon substrate 10, which has n- or p-type conductivity is firstly provided. On the surface of the substrate 10 is a silicon dioxide layer 12 having a thickness of about 1000 to 3000 angstroms, which is formed by a conventional thermal oxidation method. P-type ions are implanted into the substrate, followed by a drive-in process, thereby forming a p-well 11 in the substrate. The concentration of this p-well is preferably $5\times10^{15}$ to $1\times10^{16}/cm^3$.

Figure 2B:
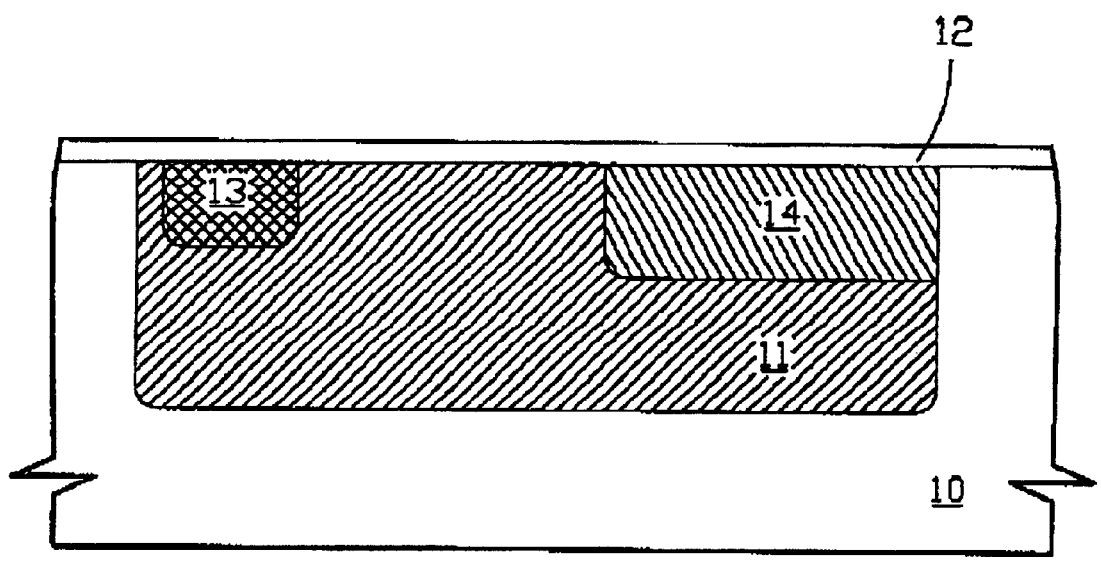

Next, as shown in FIG. 2B, p-type ions are further implanted into and driven in the p-well 11, forming a p-type sub-well 13 in the p-well 11. Also, n-type ions are implanted into and driven in the p-well 11 substrate, forming an n-type sub-well 14. It is appreciated to note that the step order of forming the p sub-well 13 and the n sub-well 14 is not material to the resultant structure of FIG. 2B. In this embodiment, the concentration of the p sub-well 13 and the n sub-well 14 is $2\times10^{16}-5\times10^{18}/cm^3$ and $8\times10^{15}-8\times10^{16}/cm^3$, respectively.

Figure 2C:
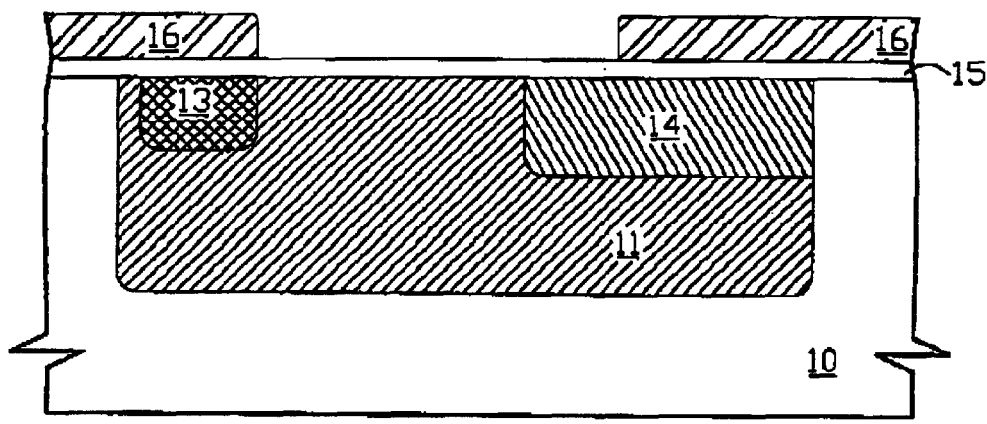

After removing the oxide layer 12, a pad silicon dioxide layer 15 is thermally grown on the surface of the substrate to a thickness on an order of hundreds of angstroms as shown in FIG. 2C. A silicon nitride layer 16 is then formed and photolithographically patterned on the pad oxide layer 15. In this embodiment, the silicon nitride layer 16 is preferably formed by a conventional low pressure chemical vapor deposition (LPCVD), method and has a resultant thickness of about 1000–2000 angstroms. The aforementioned pattern on the silicon nitride layer 16 defines a drift region, which includes a channel region between the p sub-well 13 and the n sub-well 14, and a portion of the n sub-well 14.

Figure 2D:
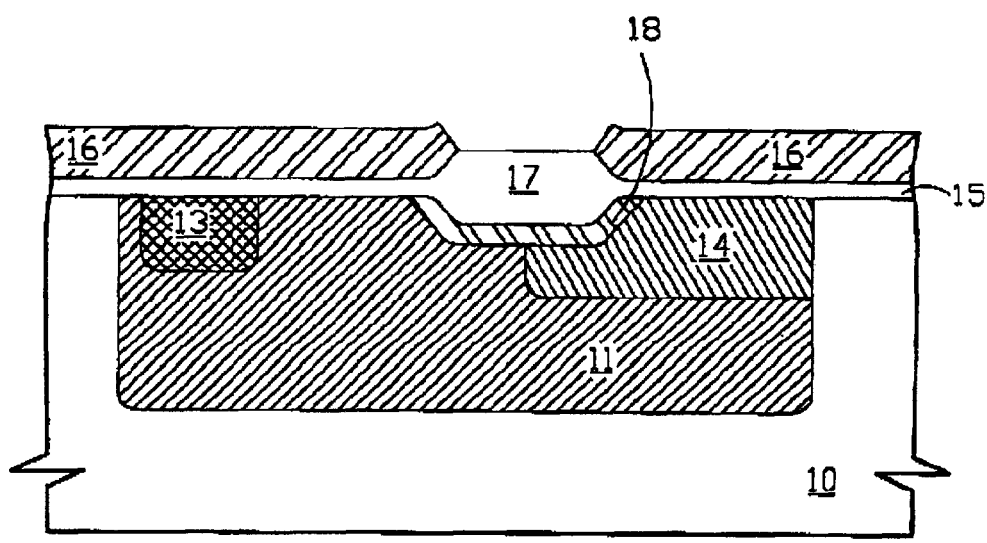

Referring to FIG. 2D, a drift region implantation is performed using the silicon nitride layer 16 as a mask, thereby forming a drift region 18 in the substrate. The substrate is then subjected to a conventional local oxidation (LOCOS) method, forming a field oxide region 17 having a thickness on an order of thousands of angstroms over the drift region 18.

Figure 2E:
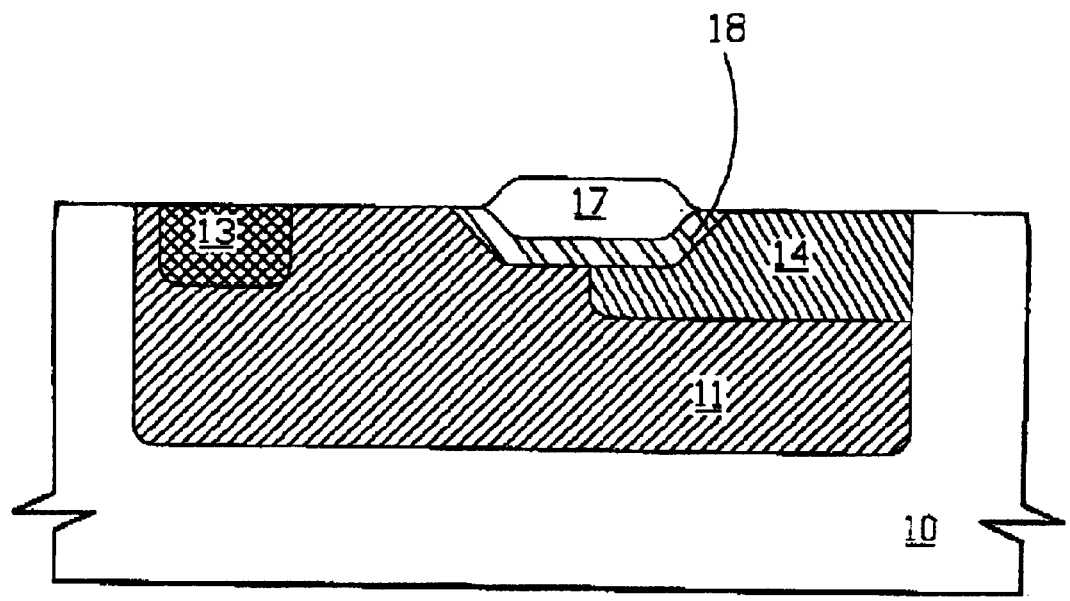
Figure 2F:
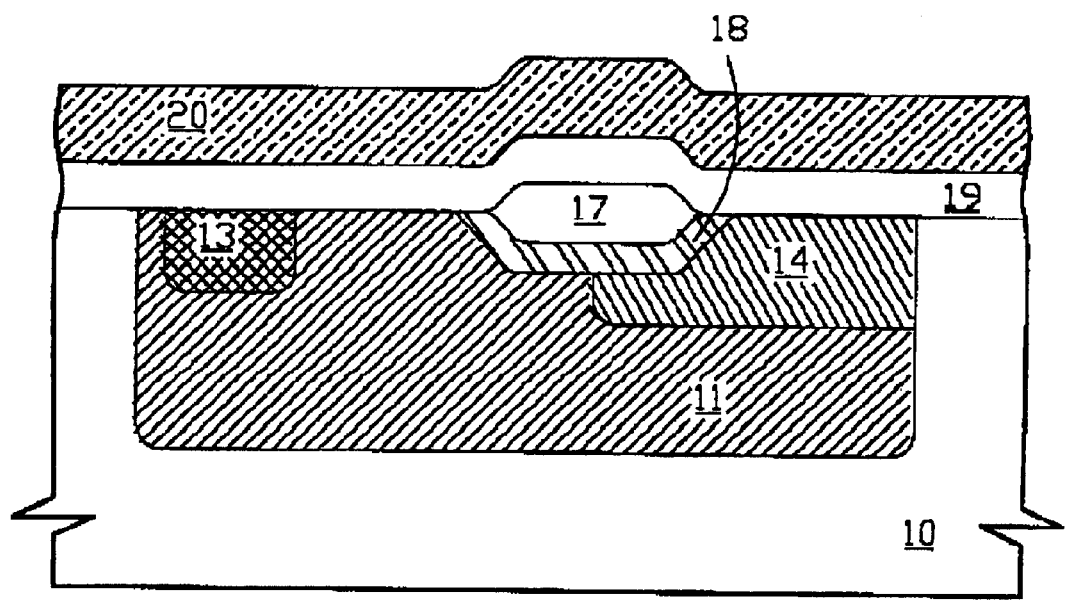

The silicon nitride layer 16 and the pad oxide layer 15 are then removed, resulting in the structure shown in FIG. 2E. Subsequently, a gate oxide layer 19 and a polysilicon layer 20 are formed on the resultant structure as shown in FIG. 2F. In this embodiment, the gate oxide layer 19 is formed by a conventional low pressure chemical vapor deposition (LPCVD) method, and the polysilicon layer 20 preferably has a thickness of about 2000 to 3000 angstroms.

Figure 2G:
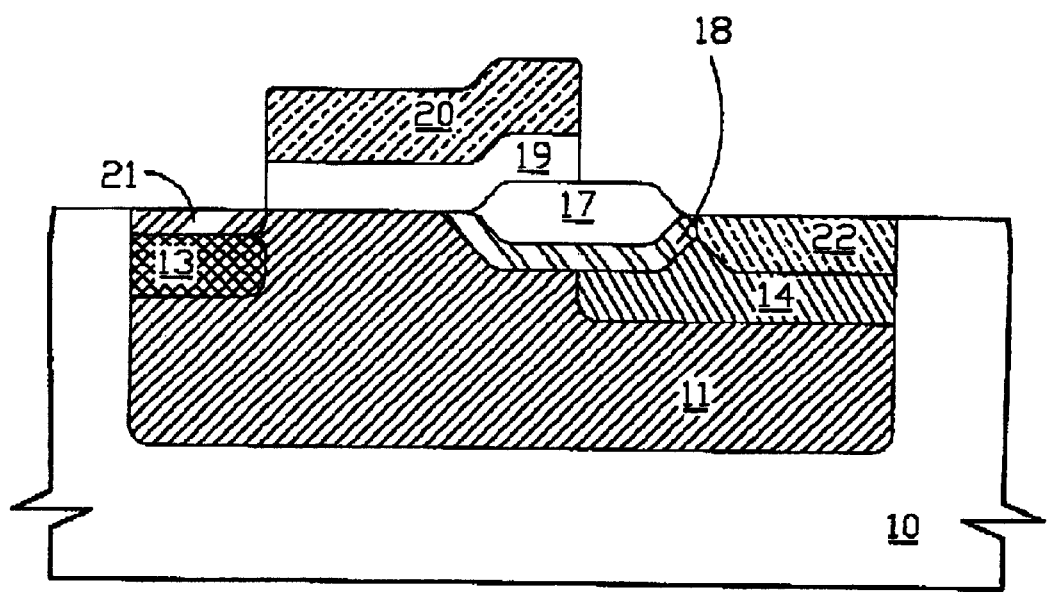

Referring to FIG. 2G, the gate oxide layer 19 and the polysilicon layer 20 are photolithographically patterned and etched to form a polysilicon gate. Finally, n-type ions are implanted into the substrate using the field oxide region 17 and the polysilicon gate 19 and 20, as a mask, thereby resulting in source/drain regions 21 and 22 on the wells 13 and 14 respectively, and therefore doping the polysilicon layer 20. The structure of the source/drain of the formed semiconductor device can be a conventional lightly-doped drain (LDD) structure.

According to the present invention, the n sub-well 14 has a deep profile, which is used to absorb charge in the bulk area of the semiconductor device, thus increasing its breakdown voltage. Furthermore, the high concentration of the p sub-well 13 decreases the possibility of carrier absorption by the substrate, and thus decreases lateral bipolar junction gain. Accordingly, the snap-back voltage of the semiconductor device can be substantially improved.

Moreover, the one-sided gate structure of the formed device according to the present invention saves substantial chip area, making high integration of circuits possible.

Although specific embodiments have been illustrated and described, it will be obvious to those skilled in the art that various modifications may be made without departing from what is intended to be limited solely by the appended claims.

What is claimed is:

1. A method for forming a high-voltage semiconductor device, comprising:
    providing a semiconductor substrate;
    forming a well having a first conductivity type in said substrate;
    forming a first sub-well having the first conductivity type, and a second sub-well having a second conductivity type contrary to the first conductivity type, both the first sub-well and the second sub-well locating in said well;
    defining a drift region using a mask over the substrate and forming a drift region, a substantial portion of the drift region abutting said second sub-well;
    forming a field oxide region on said drift region;
    forming a gate region over the substrate, a portion of said gate region abutting said field oxide region; and
    implanting ions to form a source/drain region in said substrate using the gate region and the field oxide region as a mask.

2. The method according to claim 1, wherein said provided substrate has n-type conductivity or p-type conductivity.

3. The method according to claim 1, wherein said well is formed by implanted n-type or p-type ions into said substrate, followed by drive-in process.

4. The method according to claim 2, wherein said first sub-well and said second sub-well are formed by implanted n-type or p-type ions into said substrate, followed by drive-in process.

5. The method according to claim 1, wherein said forming the field oxide region comprises firstly forming a silicon nitride layer over the substrate.

6. The method according to claim 1, wherein said gate region comprises polysilicon.

7. A method for forming a high-voltage semiconductor device, comprising:
    providing a semiconductor substrate;
    forming an oxide layer on said substrate;
    firstly implanting ions into said substrate, followed by driving in said ions to form a well having a first conductivity type in said substrate;
    secondly implanting ions into said substrate, followed by driving in said ions to form a first sub-well having the first conductivity type, and a second sub-well having a second conductivity type contrary to the first conductivity type, both the first sub-well and the second sub-well located in said well;
    removing said oxide layer;
    forming a pad oxide layer on said substrate;
    forming a silicon nitride layer on said pad oxide layer;
    defining a drift region using the silicon nitride layer as a mask and forming a drift region, a substantial portion of the drift region abutting said second sub-well;
    forming a field oxide region on said drift region;
    removing said silicon nitride layer and said pad oxide layer;
    forming a polysilicon gate region over the substrate, a portion of said gate region abutting said field oxide region; and
    implanting ions to form a source/drain region in said substrate using the gate region and the field oxide region as a mask.

8. The method according to claim 7, wherein said first sub-well and said second sub-well are formed by implanted n-type or p-type ions into said substrate, followed by drive-in process.

9. The method according to claim 8, wherein said field oxide region is formed by a local oxidation process.

10. The method according to claim 7, wherein said oxide layer comprises silicon dioxide.

11. The method according to claim 7, further comprising doping said gate region.

12. The method according to claim 7, wherein said source/drain region comprises a lightly-doped drain structure.

* * * * *